United States Patent
Chao et al.

[11] Patent Number: 5,726,497
[45] Date of Patent: Mar. 10, 1998

[54] UPWARD PLUG FILLED VIA HOLE DEVICE

[75] Inventors: Ying-Chen Chao; Ting-Hwang Lin; Jin-Yuan Lee, all of Hsin-Chu, Taiwan

[73] Assignee: Taiwan Semiconductor Manufacturing Company, Ltd., Hsin-Chu, Taiwan

[21] Appl. No.: 627,842

[22] Filed: Apr. 3, 1996

Related U.S. Application Data

[60] Continuation of Ser. No. 371,388, Jan. 11, 1995, abandoned, which is a division of Ser. No. 270,668, Jul. 5, 1994, Pat. No. 5,385,868.

[51] Int. Cl.[6] .............. H01L 23/52; H01L 29/12; B32B 15/04; B32B 9/04
[52] U.S. Cl. .............. 257/758; 257/751; 257/915; 437/190; 428/332; 428/688; 428/704; 428/650; 428/660
[58] Field of Search .............. 428/457, 469, 428/472, 688, 698, 699, 704, 213, 215, 216, 650, 660, 332; 257/764, 765, 768, 770, 769, 774, 759, 758, 752, 751, 915; 437/190, 195

[56] References Cited

U.S. PATENT DOCUMENTS

| | | | |
|---|---|---|---|
| 4,381,595 | 5/1983 | Denda et al. | 29/589 |
| 4,782,380 | 11/1988 | Shankar et al. | 357/71 |
| 5,082,801 | 1/1992 | Nagata | 437/190 |
| 5,084,414 | 1/1992 | Manley et al. | 437/189 |
| 5,200,360 | 4/1993 | Bradbury | 437/192 |
| 5,360,994 | 11/1994 | Wolters | 257/751 |

OTHER PUBLICATIONS

Sze, VLSI Technology, McGraw–Hill Book Company, p. 409, (1988) no month.

Primary Examiner—John J. Zimmerman
Assistant Examiner—Michael LaVilla
Attorney, Agent, or Firm—George O. Saile; Stephen B. Ackerman; Graham S. Jones, II

[57] ABSTRACT

A method of manufacture of a semiconductor device on a silicon semiconductor substrate comprises formation of a first stress layer on the semiconductor substrate, formation of an interconnect layer over the first stress layer, formation of a second stress layer on the interconnect layer, formation of an inter-metal dielectric (IMD) layer over the second stress layer, patterning and etching a via opening through the inter-metal dielectric layer and the second stress layer exposing a contact area on the surface of the metal interconnect layer, and heating the device at a temperature sufficient to squeeze the metal interconnect layer up into the via.

17 Claims, 3 Drawing Sheets

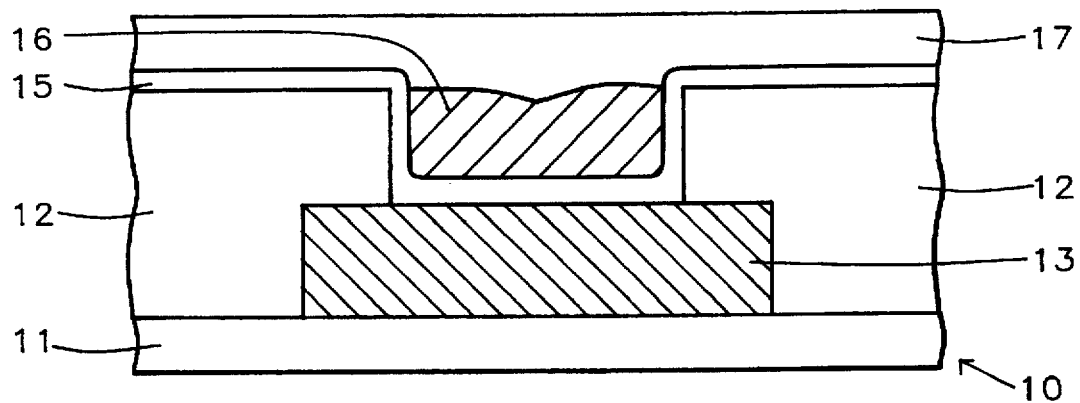
*FIG. 1 - Prior Art*
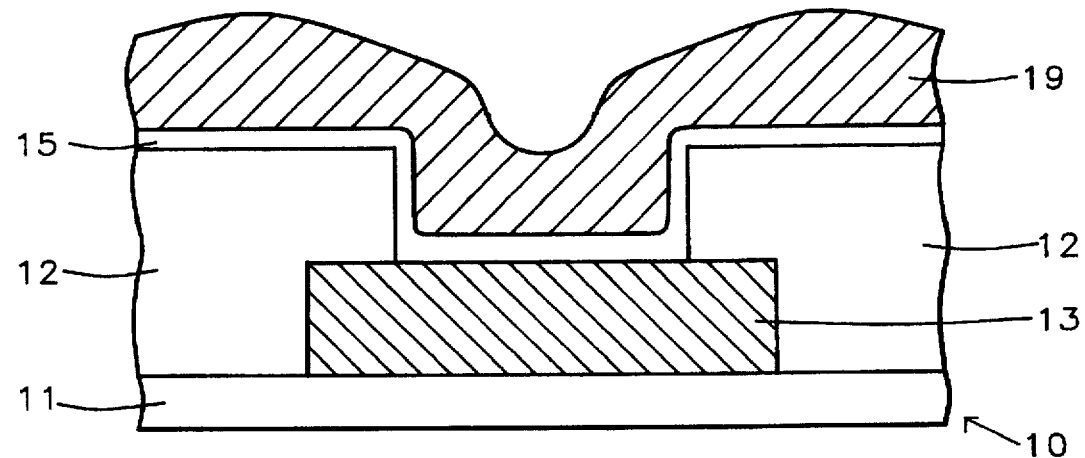
*FIG. 2 - Prior Art*

UPWARD PLUG FILLED VIA HOLE DEVICE

The application is a continuation of application Ser. No. 08/371,388 filed on Jan. 11, 1995 now abandoned, which was a division of application Ser. No. 08/270,668, filed Jul. 5, 1994, now U.S. Pat. No. 5,385,868.

BACKGROUND OF THE INVENTION

1. Field of the Invention

This invention relates to VLSI technology and more particularly to improved VIA structures therein.

2. Description of Related Art

Metal VIA plugs are used to planarize VIA holes, in addition to connecting upper level metals and lower level metals. The current practice is to employ a tungsten plug, requiring a well controlled VIA hole profile, which requires a complex manufacturing process.

FIG. 1 shows a prior art device 10 with a tungsten via metal via plug 16 formed from the top down. Device 10 includes a silicon substrate 11, upon which conductor 13 is formed. A blanket dielectric layer 12 covers the substrate 11 and a portion of the conductor 13. Above the central portion pad 13 is a tungsten via plug 16 formed in an opening in dielectric layer 12. Before the plug 16 was formed a "glue" bonding layer 15 composed of TiN/Ti was blanket deposited over the dielectric layer 12. The plug 16 was formed by first forming a blanket deposit of a tungsten film on the bonding layer 15. Then a blanket etch back step, or a polish back step, is performed so that all of the tungsten is removed except in the via hole. After the tungsten plug 16 has been formed, a conductor layer 17 was formed composed of aluminum alloy/titanium.

FIG. 2 shows another prior art device 10 different from FIG. 1, in part, because of the substitution of aluminum metal plug 19 for tungsten metal via plug 16. The process by which the device of FIG. 2 is formed comprises the blanket deposition of a barrier metal layer 15 first, and then an aluminum metal layer was deposited at an elevated temperature so that the via hole is filled by aluminum metal. Alternatively, the wafer may be subjected to an elevated temperature treatment after aluminum deposition in order to make aluminum flow and fill the via hole. The major problem associated with this method is that the elevated temperature, >400° C. is very sensitive to cause device junction leakage.

Note that in Sze, VLSI Technology, McGraw-Hill Book Company, page 409, (1988) it is stated that "Diffusion barriers such as TiN, TiC, and Ti—W are found to be stable at 450° C., and no metallurgical or electrical degradation of the silicide-barrier-aluminum contact metallization has been reported at 450° C. as long as these barrier films are pinhole free. Generally a thickness in the range of 500–1000 Å is appropriate. Note that TiN and TiC are the compounds of nitrogen and carbon with titanium, respectively, whereas Ti—W is a deposited mixture of the two elements, which may form intermetallic compound or compounds depending on the heat treatment following the deposition."

SUMMARY OF THE INVENTION

In accordance with this invention a method of manufacture of a semiconductor device on a silicon semiconductor substrate comprising formation of a first stress layer on the semiconductor substrate, formation of an interconnect layer over the first stress layer, formation of a second stress layer on the interconnect layer, formation of an inter-metal dielectric (IMD) layer over the second stress layer, patterning and etching a via opening through the inter-metal dielectric layer and the second stress layer exposing a contact area on the surface of the metal interconnect layer, and heating the device at a temperature sufficient to squeeze the metal interconnect layer up into the via.

Preferably, the device is heated to a temperature below a maximum of 600° C. or to a temperature, within a preferred range from 420° C. to 550° C.

Preferably, the stress layer material selected from TiN and Ti—W is formed by the process of sputtering, MBE, or CVD at a temperature within the range from room temperature to 450° C. in a sputtering or CVD chamber.

Preferably, the IMD layer is preferably composed of $SiO_2$ or a material selected from $SiO_2$, BPSG, SOG, $O_3$-TEOS, and ($Si_3N_4$); the IMD layer being formed by the process of PECVD, APCVD, or LPCVD at a temperature within the range 200° C. to 500° C.; the preferred temperature being within the range 200° C. to 400° C. in a PECVD chamber, within the range 400° C. to 500° C. in a APCVD chamber, or about range 400° C. to 500° C. in a LPCVD chamber.

Preferably, the stress layers are formed from a material selected from TiN and Ti—W having a composition of TiN 1:1 and TiW 1:9.

Preferably, the interconnect layer comprises a material selected from aluminum, aluminum alloys with copper in small percentages and aluminum alloys with silicon in small percentages.

Preferably, an IMD layer is formed over the second stress layer, the IMD layer being composed of a material selected from $SiO_2$, BPSG, SOG, $O_3$-TEOS, and ($Si_3N_4$).

Preferably, the stress layer is formed from a material selected from TiN and Ti—W having a composition of TiN 1:1 and TiW 1:9.

Preferably, the metal interconnect layer is formed by the process of sputtering, MBE, or CVD at a temperature within the range from room temperature to 450° C. in a PVD (sputtering or MBE) or CVD (MOCVD) chamber.

In accordance with another aspect of this invention, a semiconductor device on a silicon semiconductor substrate comprising a first stress layer on the semiconductor substrate, an interconnect layer over the first stress layer, a second stress layer on the interconnect layer, an inter-metal dielectric (IMD) layer over the second stress layer, a via opening through the inter-metal dielectric layer and the second stress layer down to a contact area on the surface of the metal interconnect layer, and a via plug formed of metal from the interconnect layer squeezed up into the via.

BRIEF DESCRIPTION OF THE DRAWINGS

The foregoing and other aspects and advantages of this invention are explained and described below with reference to the accompanying drawings, in which:

FIG. 1 shows a prior art device with a tungsten via metal via plug formed from the top down.

FIG. 2 shows another prior art device different from FIG. 1, in part, because of the substitution of aluminum metal plug for the tungsten metal via plug.

FIG. 4 shows a silicon substrate is coated with a first blanket high tensile stress layer.

FIG. 5 shows the product of FIG. 4 after the mask layer has been removed and after the resulting structure has been subjected to heat treatment to form a via plug from below.

DESCRIPTION OF THE PREFERRED EMBODIMENT

Figure 3:
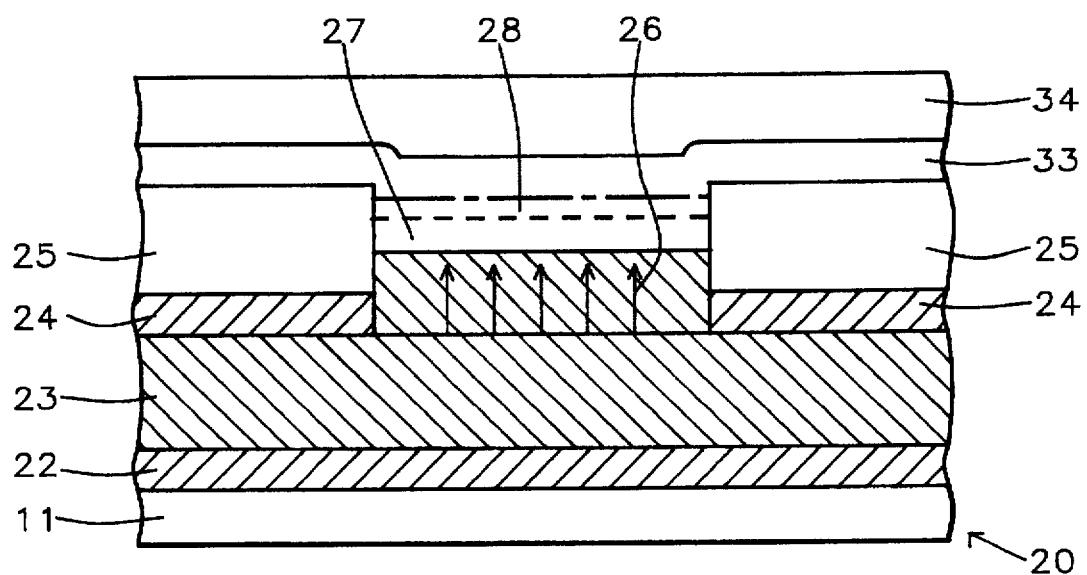
FIG. 3 illustrates an upward method of forming a metal plug made in accordance with this invention.

Device 20 is illustrated in FIG. 3, which shows an upward method of forming a metal plug made in accordance with this invention. A silicon substrate 11 is coated with a high tensile stress layer 22 of TiN or Ti—W. Above high tensile stress layer 22 is an aluminum layer 23 deposited upon high tensile stress layer 22. Above aluminum layer 23 is a high tensile stress layer 24 of TiN or Ti—W. Above tensile stress layer 24 is a silicon dioxide layer 25. Through tensile and silicon dioxide layers 24 and 25 a via opening has been formed from above, as would be done in the prior art. However, the difference is that the aluminum layer 23 is forced upwardly during heat treatment to erupt into the via opening forming a via plug as indicated by the arrows 26 and lines 27 and 28 indicating the levels of expansion of aluminum during the process of this invention. The TiN or Ti—W high tensile stress layer plus a covering layer of $SiO_x$ are employed to provide enough tensile stress for forcing the eruption of aluminum layer 23 forming a via plug as indicated by arrows 26 to levels 27 and 28. The metal layer 23 is changed into a metal structure including the blanket layer 23 and including an erupted via plug 26 (32 in FIG. 5) extending upwardly from the blanket layer. The via plug has sidewalls and a top surface. See the description below of layers 33 and 34, after the description of FIG. 5.

Figure 4:
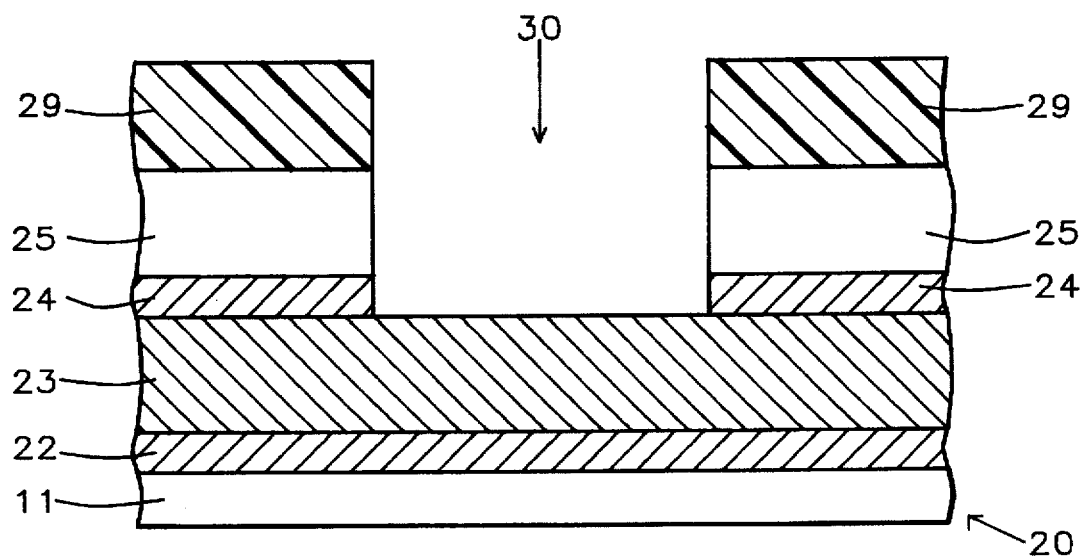
In FIGS. 4 and 5, the process of the invention is described in greater detail.
Figure 5:
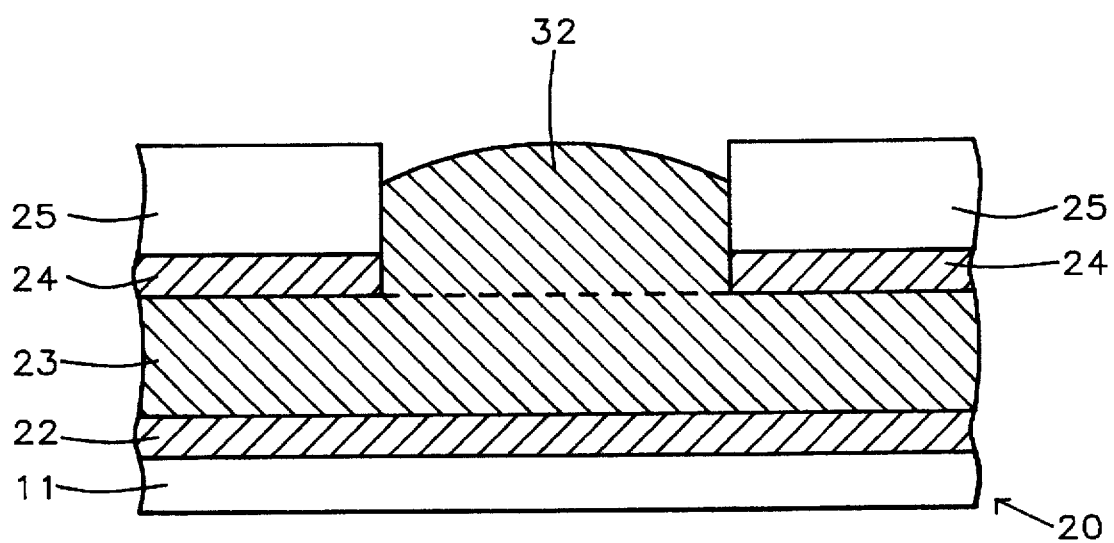

Referring to FIGS. 4 and 5, the process of the invention is described in greater detail.

Referring to FIG. 4, a silicon substrate 11 is coated with a first blanket high tensile stress layer 22 having a thickness of from about 600 Å to about 2,000 Å, and it is preferably composed of TiN or Ti—W, but it can also be composed of TiN/Ti, TiW/Ti, or TiWN/Ti. Layer 22 can be formed by a process of sputtering, MBE (Molecular Beam Epitaxy), or CVD (Chemical Vapor Deposition) at a temperature within the range from room temperature to 450° C.

Next, a metal "interconnects" layer 23, preferably composed of aluminum is formed in a blanket form over high tensile stress layer 22. Layer 23 has a thickness of from about 4,000 Å to about 11,000 Å, and it is preferably composed of aluminum, but it can also be composed of aluminum alloys with copper and aluminum alloys with silicon in small percentages. Layer 23 can be formed by a process of PVD (sputtering or MBE), or MOCVD, at a temperature within the range from room temperature to 450° C.

Then a second blanket high tensile stress layer 24 is formed on layer 23 having a thickness of from about 150 Å to about 1,200 Å, and it is preferably composed of TiN or Ti—W, but it can also be composed of TiWN. Layer 24 can be formed by a process of PVD (sputtering or MBE) or CVD at a temperature within the range from room temperature to 450° C.

Next a blanket Plasma Enhanced CVD (PECVD) IMD (inter-metal dielectric) 25 is formed over second stress layer 24. IMD layer 25 has a thickness of from about 5,000 Å to about 12,000 Å, and it is preferably composed of $SiO_2$, but it can also be composed of BPSG, SOG, $O_3$-TEOS, silicon nitride ($Si_3N_4$) or other dielectric materials. Layer 25 can be formed by a process of PECVD, APCVD, or LPCVD at a temperature within the range 200° C. to 450° C. For example, a deposit of a layer 25 of BPSG can include a preferred concentration of boron (B) of about 3.0 wt. % (preferably within the range from about 2.5 wt. % to about 5 wt. %) and with a preferred concentration of phosphorous (P) of about 5.2 wt. % (preferably within the range from about 3 wt. % to about 5.5 wt. %). The process used to deposit the BPSG layer 25 comprises an instrument selected from APCVD (Atmospheric Pressure CVD), PECVD (Plasma Enhanced CVD), LPCVD (Low Pressure CVD) (Low Pressure C.V.D.) which deposits BPSG, BPTEOS, TEOS, etc.

Then a photoresist masking layer 29 is formed over IMD layer 25 and it is patterned by a conventional process of photolithography with an opening 30 therein for etching a via hole 30.

Then using the mask 29, an etching process of RIE (reactive ion etching), plasma etching, or chemical wet etching is performed using a dry or wet etchant selected from $SF_6$, $CF_4$, $CHF_3$ or HF to etch through layers 25 and 24 down to aluminum layer 23 which acts as an etch stop, to form via hole 30.

FIG. 5 shows the product of FIG. 4 after the mask layer 29 has been removed and after the resulting structure has been subjected to heat treatment at a temperature preferably within the range 420° C. to 550° C. in a furnace, or on a hot plate and below a maximum of 600° C. leading to aluminum volume expansion to form via plug 32 from below. The in-situ sputtering degas step is performed by use of a hot plate in a vacuum environment.

The metal interconnect layer 23 is encapsulated with layers 22 and 24 of relatively stiff materials selected from the group consisting of diffusion barriers such as TiN and Ti—W. The IMD (inter-metal dielectric) has to be deposited with compressive stress. After the IMD layer 25 is deposited, the via holes 30 are opened and the bottom of the via holes, the TiN or Ti—W layer 24 must be penetrated and the material removed down to the metal interconnect 23.

Then the via plugs 32 are formed by subsequent heat treatment. This heat treatment can be performed in a furnace or on a hot plate, can be a separate treatment or can be incorporated into subsequent metal depositions in a precleaning process. The via plugs 32 are squeezed up by compressive forces (as indicated by arrows 26 in the via plug shown in FIG. 3) through the opening in the high tensile stress layer 24 IMD layer 25 at the elevated temperatures. Via plug 32 has sidewalls surrounded by layers 24 and 25 and a top surface.

A conventional Applied Materials Corporation multiple chamber processing apparatus can be used to deposit titanium, Ti—N and aluminum in separate chambers as required.

Referring to FIG. 3, after the upward aluminum (Al) plug formation, a level-two interconnect metal composed of a barrier layer 33, TiW, TiN or TiWN and interconnect layer 34, Al, AlSi, AlCu, or AlSiCu are then deposited over erupted aluminum layer 23 and silicon dioxide layer 25.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device on a silicon semiconductor substrate comprising:
    a first high tensile stress layer on said semiconductor substrate,
    a first interconnect metal structure formed over said first high tensile stress layer, said first interconnect metal structure including a blanket layer and including an erupted via plug extending upwardly from said blanket layer, said via plug having sidewalls and a top surface,
    a second high tensile stress layer formed over said blanket layer of said first interconnect metal structure and around said via plug,
    a dielectric layer over said second high tensile stress layer and around said sidewalls of said via plug, and
    a second level interconnect metal formed over said dielectric layer and over the top surface of said via plug,
    whereby said via plug which is composed of metal erupted from said blanket layer of said first interconnect metal structure extends up through said second high tensile stress layer and said dielectric layer into contact with said second level interconnect metal.

2. The device of claim 1 wherein said high tensile stress layers are formed from TiN.

3. The device of claim 1 wherein said high tensile stress layers are formed from Ti—W.

4. The device of claim 1 wherein said dielectric layer is formed from a material selected from the group consisting of silicon oxide, BPSG, SOG and silicon nitride.

5. The device of claim 1 wherein said dielectric layer is formed over said second high tensile stress layer and around said sidewalls of said via plug and said dielectric layer is composed of silicon oxide.

6. The device of claim 1 wherein said first interconnect metal structure is composed of aluminum.

7. The device of claim 5 wherein
    said first interconnect metal structure comprises a material selected from the group consisting of aluminum, aluminum alloys with copper in small percentages and aluminum alloys with silicon in small percentages, and
    said second interconnect metal comprises:
    a) a barrier layer comprising a material selected from the group consisting of TiW, TiN and TiWN and
    b) an interconnect layer comprising a material selected from the group consisting of Al, AlSi, AlCu and AlSiCu.

8. The device of claim 3 with said dielectric layer being composed of a material selected from $SiO_2$, BPSG, SOG, and ($Si_3N_4$).

9. The device of claim 2 wherein said first interconnect metal structure including said blanket layer and said via comprises a metal selected from the group consisting of a sputtered metal, an epitaxial metal, and a MOCVD metal.

10. The device of claim 9 wherein said first interconnect metal structure including said blanket layer and said via comprises a material selected from the group consisting of aluminum, aluminum alloys with copper in small percentages and aluminum alloys with silicon in small percentages.

11. The device of claim 1 wherein said first interconnect metal structure comprises a metal selected from the group consisting of a sputtered metal, an epitaxial metal, and a MOCVD metal, and
    said first high tensile stress layer was formed from a material selected from the group consisting of TiN and Ti—W.

12. The device of claim 1 wherein said first interconnect metal structure comprises a metal selected from the group consisting of a sputtered metal, an epitaxial metal, and a MOCVD metal, and
    said first and second high tensile stress layers comprise a material selected from the group consisting of TiN and Ti—W.

13. A semiconductor device on a silicon semiconductor substrate, said substrate having a surface comprising:
    a first high tensile stress layer formed on said surface of said semiconductor substrate,
    a metal interconnect structure formed over said first high tensile stress layer, said metal interconnect structure including a blanket layer and a via plug extending upwardly from said blanket layer, said via plug having a top surface and sidewalls,
    a second high tensile stress layer formed over said metal interconnect layer and around said sidewalls of said via plug,
    a dielectric layer formed over said second high tensile stress layer and around said sidewalls of said via plug,
    said dielectric layer is formed from a material selected from the group consisting of silicon oxide, BPSG, SOG and silicon nitride,
    with at least one of said high tensile stress layers formed from a material selected from the group consisting of TiN and Ti—W,
    a metallic barrier layer comprising a material selected from the group consisting of TiW, TiN and TiWN, formed over said dielectric layer and over said top surface of said via plug, and
    a second metal interconnect layer formed over said barrier layer,
    whereby said via plug composed of metal from said metal interconnect layer extends from said interconnect layer up through said second high tensile stress layer and said dielectric layer.

14. A semiconductor device on a silicon semiconductor substrate comprising:
    a first high tensile stress layer on said semiconductor substrate said first high tensile stress layer comprising a material selected from the group consisting of TiN, Ti—W, TiN/Ti, TiW/Ti, and TiWN/Ti,
    a first metal interconnect structure formed over said first high tensile stress layer,
    said first metal interconnect structure comprising a material selected from the group consisting of aluminum, aluminum alloys with copper and aluminum alloys with silicon in small percentages,
    said first metal interconnect structure including a blanket layer and a via plug erupted from said blanket layer of said first metal interconnect layer extending upwardly therefrom, said via plug having a top surface and sidewalls,
    a second high tensile stress layer formed over said blanket layer and around said sidewalls of said via plug, said second high tensile stress layer comprising a material selected from the group consisting of TiN, Ti—W, and TiWN, a dielectric layer formed over said second high tensile stress layer around said sidewalls of said via plug, said dielectric layer being composed of a material selected from $SiO_2$, BPSG, SOG, and $(Si_3N_4)$, a via hole formed through said dielectric layer and said second high tensile stress layer down to a contact area on the surface of said first metal interconnect layer, said via plug extending up through said via hole, a barrier layer comprising a material selected from the group consisting of TiW, TiN and TiWN, formed over said dielectric layer and over top surface of said via plug, and a second metal interconnect layer being formed over said barrier layer, said second metal interconnect layer comprising a material selected from the group consisting of aluminum, aluminum silicon, aluminum copper and aluminum silicon copper, whereby a via plug formed of metal erupted from said first metal interconnect layer fills said via space.

15. The device of claim 14 with said high tensile stress layers formed from a material selected from the group consisting of TiN and Ti—W.

16. The device of claim 15 comprising:

said first high tensile stress layer on said semiconductor substrate said first high tensile stress layer having a thickness between about 600 Å and about 2,000 Å, said blanket layer of said first metal interconnect structure having a thickness between about 4,000 Å and about 11,000 Å, said second high tensile stress layer having a thickness between about 150 Å and about 1,200 Å, and said dielectric layer over said second high tensile stress layer having a thickness between about 5,000 Å and about 12,000 Å.

17. The device of claim 14 comprising:

said first high tensile stress layer on said semiconductor substrate having a thickness between about 600 Å and about 2,000 Å, said blanket layer having a thickness between about 4,000 Å and about 11,000 Å, said second high tensile stress layer having a thickness between about 150 Å and about 1,200 Å, and said dielectric layer over said second high tensile stress layer having a thickness between about 5,000 Å and about 12,000 Å.

* * * * *